United States Patent
Fagg

(10) Patent No.: US 7,656,230 B2
(45) Date of Patent: Feb. 2, 2010

(54) QUADRATURE OUTPUT LOW NOISE TRANSCONDUCTANCE AMPLIFIER HAVING DIFFERENTIAL INPUT

(75) Inventor: Russell Fagg, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 15 days.

(21) Appl. No.: 12/053,249

(22) Filed: Mar. 21, 2008

(65) Prior Publication Data
US 2009/0237161 A1 Sep. 24, 2009

(51) Int. Cl.
*H03F 3/45* (2006.01)
(52) U.S. Cl. ...................... 330/253; 330/261
(58) Field of Classification Search ................ 330/253, 330/261, 310, 150, 98
See application file for complete search history.

(56) References Cited
U.S. PATENT DOCUMENTS

| | | | |
|---|---|---|---|
| 6,639,431 B1 * | 10/2003 | Potter | 327/65 |
| 6,970,043 B2 * | 11/2005 | Pradhan et al. | 330/253 |
| 7,157,970 B2 * | 1/2007 | Dawes | 330/253 |
| 7,425,745 B2 | 9/2008 | Ohta | |
| 2002/0098820 A1 | 7/2002 | Dijkmans et al. | |

FOREIGN PATENT DOCUMENTS

WO 05029696 3/2005

OTHER PUBLICATIONS

International Search Report, PCT/US2009/037890 - International Search Authority - European Patent Office, Jun. 22, 2009.
Written Opinion, PCT/US2009/037890 - International Search Authority - European Patent Office, Jun. 22, 2009.

* cited by examiner

*Primary Examiner*—Henry K Choe
(74) *Attorney, Agent, or Firm*—Sandra L. Godsey; William M. Hooks

(57) ABSTRACT

A device for providing low noise transconductance amplification is presented. The device includes a PMOS transconductance section configured to receive a differential RF input signal, a PMOS cascode section coupled to the PMOS transconductance section, an NMOS transconductance section configured to receive the RF differential input signal, and an NMOS cascode section coupled to the NMOS transconductance section, where the PMOS and NMOS cascode sections provide a differential quadrature output signal and a differential in-phase output signal. A method for amplifying an RF signal is also presented. The method includes receiving a differential RF input signal, converting the differential RF input signal into current signals, buffering the current signals to provide a differential quadrature output signal and a differential in-phase output signal.

26 Claims, 5 Drawing Sheets

QUADRATURE OUTPUT LOW NOISE TRANSCONDUCTANCE AMPLIFIER HAVING DIFFERENTIAL INPUT

FIELD OF DISCLOSURE

The embodiments of the disclosure relate generally to amplifiers, and more specifically, to a Low Noise Transconductance Amplifier (LNTA) capable of accepting differential RF input signals and providing amplified differential in-phase and quadrature (I/Q) output signals.

BACKGROUND

The increasing demand for low cost, miniaturized, power efficient communication systems is driving the requirement for higher levels of functionality to be incorporated within integrated circuits. To minimize the area and associated costs of these integrated circuits, novel and innovative means of providing low noise amplification in environments which may have high levels of interference is highly desirable. However, such benefits should not be obtained at the cost reducing performance requirements, such as, for example, linearity and/or power consumption. Maintaining existing performance requirements is important because emerging communication standards have rigorous receiver desensitization requirements and receiver power consumption must be minimized to maintain a competitive advantage.

Once class of low noise amplifiers includes a Low Noise Transconductance Amplifier (LNTA), which generally behaves as a voltage controlled current source (i.e., provides an output current based upon an input voltage signal). Conventional LNTA designs have partitioned their functions into two blocks; an LNA (Low Noise Amplification) block followed by a TA (Transconductance Amplification) block. This partitioning allows designers to reuse existing LNA intellectual property but may result in a suboptimum design that can use greater power and die area with reduced linearity and thus immunity from interfering signals. The conventionally partitioned LNTA design may be fundamentally limited by the LNA stage that must provide considerable voltage gain to obtain adequate transconductance from the LNA/TA combination. Moreover, the LNA may also utilize an inductive load to resonate out the parasitic capacitance of the TA stage. Inductors may further increase cost as they can take up a significant amount of die area on an integrated circuit, and may require additional tuning steps for proper operation. Moreover, conventional LNTA designs may duplicate amplifier circuitry in order to provide both in-phase and quadrature output signals, thus further increasing the size requirements on the integrated circuit.

Accordingly, there is a need for a single stage LNTA they can provide considerable savings in power and die area, along with improved linearity and operating bandwidth.

SUMMARY

Exemplary embodiments of the invention are directed to devices and methods for providing low noise transconductance amplification.

In one embodiment, a device for providing low noise transconductance amplification is presented. The device may include a PMOS transconductance section configured to receive a differential RF input signal, and a PMOS cascode section coupled to the PMOS transconductance section. The device may further include an NMOS transconductance section configured to receive the RF differential input signal, and an NMOS cascode section coupled to the NMOS transconductance section, where the PMOS and NMOS cascode sections may provide a differential quadrature output signal and a differential in-phase output signal.

In another embodiment, a method for amplifying an RF signal is presented. The method may include receiving a differential RF input signal, converting the differential RF input signal into current signals, buffering the current signals to provide a differential quadrature output signal and a differential in-phase output signal.

Another embodiment can include a device for providing low noise transconductance amplification, comprising: means for receiving a differential RF input signal; means for converting the differential RF input signal into current signals; and means for buffering the current signals to provide a differential quadrature output signal and a differential in-phase output signal.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
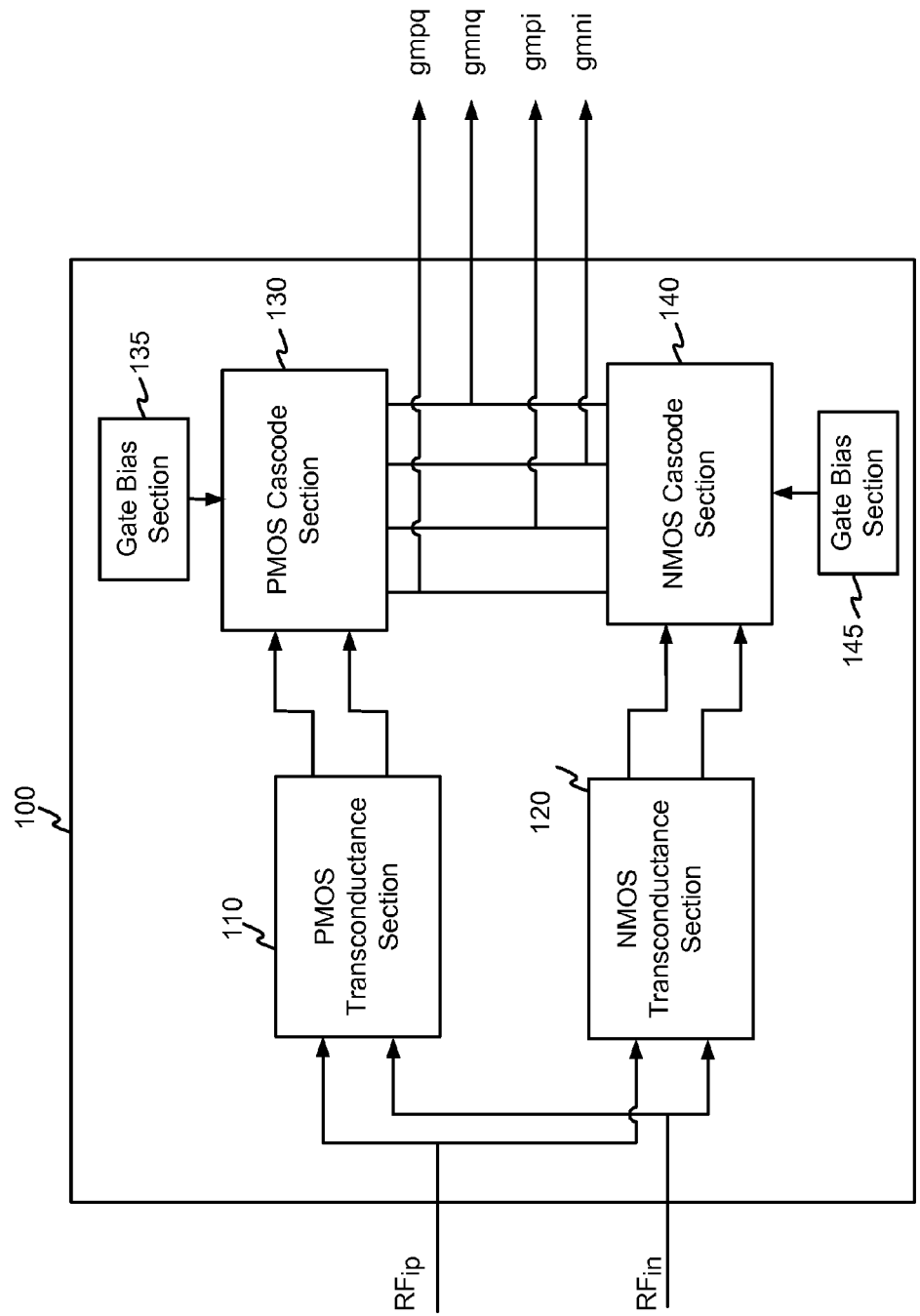
FIG. 1 shows an exemplary block diagram of an embodiment of a Low Noise Transconductance Amplifier (LNTA).

FIG. 1 shows an exemplary block diagram of a single stage Low Noise Transconductance Amplifier (LNTA) 100. The LNTA 100 may include PMOS transconductance section 110, NMOS transconductance section 120, PMOS cascode section 130, NMOS cascode section 140, and a first gate bias section 135, and a second gate bias section 145. The PMOS transconductance section 110 may receive a differential RF input signal which includes a positive line RFip and a negative line RFin. The PMOS transconductance section 110 may provide a first differential intermediate signal which includes currents having magnitudes proportional to the product of the input signal amplitude and the transconductance of PMOS transconductance section 110. The first differential intermediate signal is conveyed by the PMOS cascode section 130 to produce the positive in-phase line (gmpi) and the positive quadrature line (gmpq) output signals.

The NMOS transconductance section 120 may also receive the differential RF input signal which includes a positive line RFip and a negative line RFin. The NMOS transconductance section 120 may provide a second differential intermediate signal. The second differential intermediate signal may be amplified and processed by the NMOS cascode section 140 to produce the negative in-phase line (gmni) and the negative quadrature line (gmnq) output signals.

Functionally speaking, the transconductance sections 110, 120 may convert the differential input signals at RFip/RFin into currents. The cascode sections 130, 140 may act as current buffers to convey this current to the outputs (gmpq, gmnq, gmpi, gmni) with very low loss. This may be achieved by the cascode sections 130, 140 presenting a low impedance to transconductance sections 110/120, and a high output impedance at (gmpq, gmnq, gmpi, gmni).

Providing the differential RF inputs directly into the PMOS and NMOS transconductance sections 110, 120, may provide the benefit high transconductance (e.g., high current gain in relation to input voltage signals). By having high transconductance in sections 110, 120, the requirement for a preamplifier with initial voltage gain may be reduced which may obviate the need for extra tuning circuitry, and in turn minimize the number of inductors within the integrated circuit. The PMOS and NMOS cascode sections 130, 140 may provide a high output impedance which can be desirable for maximizing the amount of current being delivered into a load, and improving the efficiency of the LNTA 100.

Further referring to FIG. 1, the LNTA 100 may include a first gate bias section 135 and a second gate bias section 145. The gate bias sections may provide gate bias voltages to each transistor in the cascode sections 130, 140 for proper operation of the LNTA 100. In one embodiment, both gate bias sections 135, 145 may provide constant voltage biases to the transistors within the PMOS cascode section 130 and the NMOS cascode section 140.

In another embodiment, the gate bias section 135 may provide constant gate bias voltages to PMOS cascode section 130, and the gate bias section 145 may provide dynamically changing gate bias voltages to the transistors within NMOS cascode section 140. In this embodiment, the gate bias section 145 may be a gate bias control system, which provides bias voltages based upon the outputs of the LNTA 100 to compensate for voltage variations within the transistors of the NMOS cascode section 140. In yet another embodiment, the gate bias sections 135 and 145 may be reversed from the previous embodiment described above, and gate bias section 135 may utilize a gate bias control system, and the gate bias section 145 may use a constant bias gate voltages.

The gate bias control system may provide an advantage of greater ease matching transistors within the cascode section, while also minimizing the use of additional tuning circuits and their associated inductors. Details regarding both the constant gate voltage biasing circuits and the gate bias control system will be presented in more detail below.

Accordingly, an embodiment of the disclosure may include a device for providing low noise transconductance amplification. The device may include a PMOS transconductance section (e.g., 110) configured to receive a differential RF input signal and a PMOS cascode section (e.g., 130) coupled to the PMOS transconductance section. The device may further include an NMOS transconductance section (e.g., 120) configured to receive the RF differential input signal, and an NMOS cascode section (e.g., 140) coupled to the NMOS transconductance section, wherein the PMOS and NMOS cascode sections provide a differential quadrature output signal and a differential in-phase output signal.

Another embodiment of the disclosure may include a method for amplifying an RF signal, wherein the method may include receiving a differential RF input signal, converting the differential RF input signal into current signals, and buffering the current signals to provide a differential quadrature output signal and a differential in-phase output signal.

Figure 2:
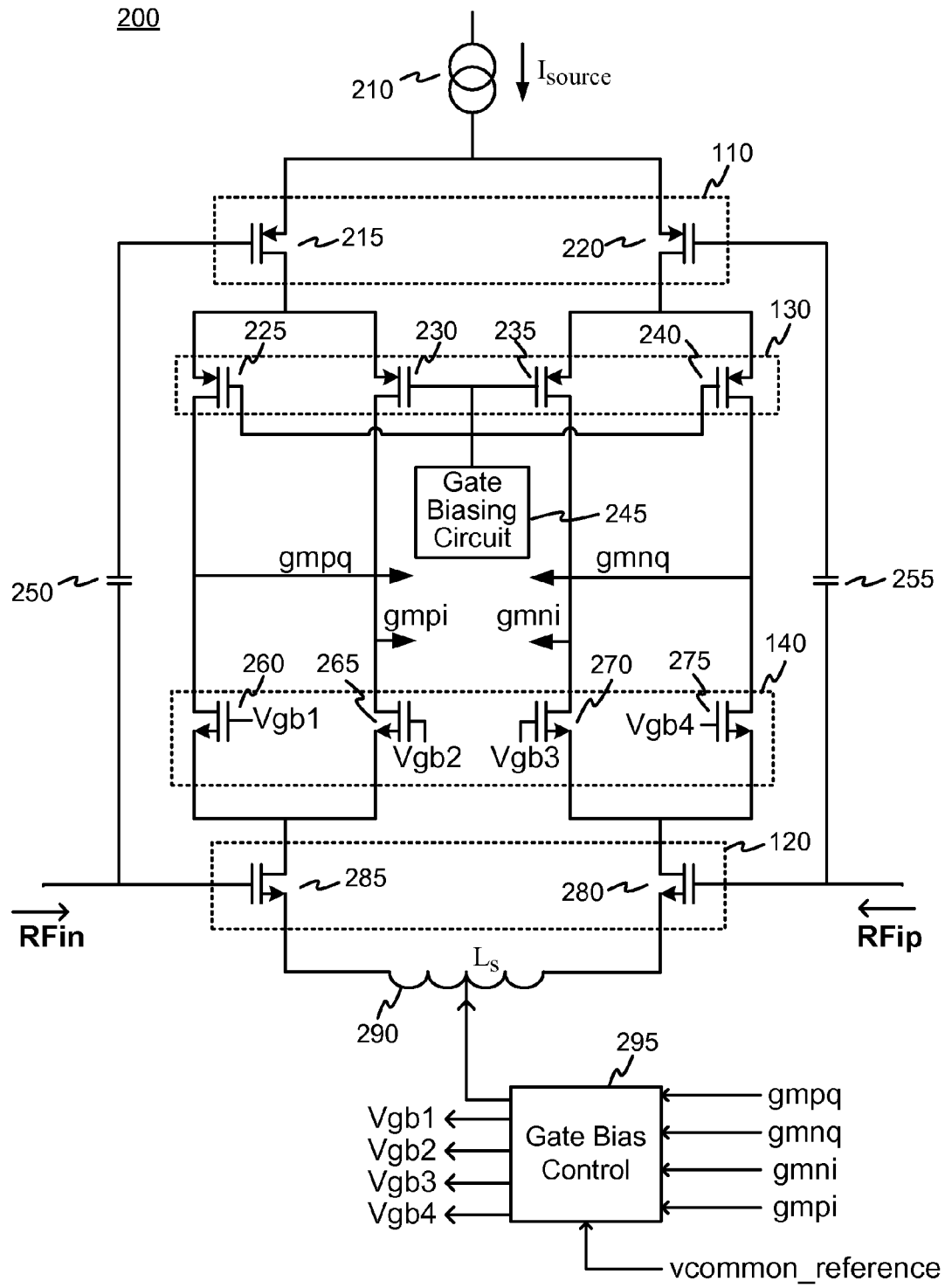
FIG. 2 shows an exemplary top-level circuit diagram of another embodiment of an LNTA.

FIG. 2 shows an exemplary circuit diagram of a single stage Low Noise Transconductance Amplifier (LNTA) 200. The LNTA 200 may include PMOS transconductance section 110, which includes PMOS transistors 215, 220; a PMOS cascode section 130, which includes PMOS transistors 225, 230, 235, 240; an NMOS transconductance section 120, which includes NMOS transistors 280 and 285; and an NMOS cascode section 140, which includes NMOS transistors 260, 265, 270, 275.

In the PMOS transconductance section 110, PMOS transistor 215 may have its gate line capacitively coupled (via capacitor 250) to the negative line of the differential RF input. PMOS transistor 215 may have its source line coupled to a current source 210 for receiving $I_{source}$, and its drain line connected to the source lines PMOS transistors 225 and 230 in the PMOS cascode section 130. Further referring to PMOS transconductance section 110, the PMOS transistor 220 may have its gate line capacitively coupled (via capacitor 255) to the positive line of the differential RF input. PMOS transistor 220 may receive a source current, $I_{source}$, from source 210 via its source line. The PMOS transistor's 220 drain line may be coupled to the source lines of PMOS transistors 235 and 240 in the PMOS cascode section 130.

In the PMOS cascode section 130, PMOS transistor 225 may have its source line coupled to the source line of transistor 230 and the drain line of transistor 215. PMOS transistor 225 may have its drain line coupled to the drain line of NMOS transistor 260 in the NMOS cascode section 140, to provide the positive line of the differential quadrature output signal (gmpq). PMOS transistor 225 may have its gate line coupled to the gate biasing circuit 245.

PMOS transistor 230 may have its source line coupled to the source line of PMOS transistor 225 and the drain line of transistor 215. PMOS transistor 230 may have its drain line coupled to the drain line of NMOS transistor 265 in the NMOS cascode section 140, to provide the positive line of the differential in-phase output signal (gmpi). PMOS transistor 230 may have its gate line coupled to the gate biasing circuit 245.

PMOS transistor 235 may have its source line coupled to the source line of PMOS transistor 240 and the drain line of transistor 220. PMOS transistor 235 may have its drain line coupled to the drain line of NMOS transistor 270 in the NMOS cascode section 140, to provide the negative line of the differential in-phase output signal (gmni). PMOS transistor 235 may have its gate line coupled to the gate biasing circuit 245.

PMOS transistor 240 may have its source line coupled to the source line of PMOS transistor 235 and the drain line of transistor 220. PMOS transistor 240 may have its drain line coupled to the drain line of NMOS transistor 275 in the NMOS cascode section 140, to provide the negative line of the differential quadrature output signal (gmnq). PMOS transistor 240 may have its gate line coupled to the gate biasing circuit 245.

The gate biasing circuit 245 may provide a constant biasing voltage to each PMOS transistor 225-240 so that the PMOS cascode section 130 operates properly. The gate biasing circuit 245 may include a voltage source with the appropriate pull-up resistors, and may utilize conventional circuit configurations used for biasing circuits.

Further referring to the embodiment shown in FIG. 2, with the NMOS transconductance section 120, NMOS transistor 285 may have its gate line connected to the negative line of the differential RF input. NMOS transistor 285 may have its source line coupled to a source degeneration inductor ($L_s$) 290, and its drain line connected to the source lines NMOS transistors 265 and 260 in the NMOS cascode section 140. Further referring to NMOS transconductance section 120, the NMOS transistor 280 may have its gate line connected to the positive line of the differential RF input. NMOS transistor 280 may have its source line coupled to the source degeneration inductor (Ls) 290. The drain line of the NMOS transistor 280 may be coupled to the source lines of NMOS transistors 275 and 270 in the NMOS cascode section 140.

In the NMOS cascode section 140, NMOS transistor 260 may have its source line coupled to the source line of NMOS transistor 265 and the drain line of NMOS transistor 285. NMOS transistor 260 may have its drain line coupled to the drain line of PMOS transistor 225 in the PMOS cascode section 130, to provide the positive line of the differential quadrature output signal (gmpq). NMOS transistor 260 may have its gate line coupled to a gate bias control 295 to receive voltage Vgb1.

NMOS transistor 265 may have its source line coupled to the source line of NMOS transistor 260 and the drain line of NMOS transistor 285. NMOS transistor 265 may have its drain line coupled to the drain line of PMOS transistor 230 in the PMOS cascode section 130, to provide the positive line of the differential in-phase output signal gmpi. NMOS transistor 265 may have its gate line coupled to the gate bias control 295 to receive voltage Vgb2.

NMOS transistor 270 may have its source line coupled to the source line of NMOS transistor 275 and the drain line of NMOS transistor 280. NMOS transistor 270 may have its drain line coupled to the drain line of PMOS transistor 235 in the PMOS cascode section 130, to provide the negative line of the differential in-phase output signal (gmni). NMOS transistor 270 may have its gate line coupled to the gate bias control 295 to receive voltage Vgb3.

NMOS transistor 275 may have its source line coupled to the source line of NMOS transistor 270 and the drain line of NMOS transistor 280. NMOS transistor 275 may have its drain line coupled to the drain line of PMOS transistor 240 in the PMOS cascode section 130, to provide the negative line of the differential quadrature output signal (gmnq). NMOS transistor 275 may have its gate line coupled to the gate bias control 295 to receive voltage Vgb4.

The gate biasing control 295 may dynamically adjust each of the gate bias voltages for the NMOS transistors 260-275 in the NMOS cascode section 140. The gate bias control 295 may receive as inputs the differential in-phase and quadrature output signals (gmpq, gmnq, gmpi, gmni), and based thereon, provide gate voltages Vgb1, Vgb2, Vgb3, and Vgb3 for NMOS transistors 260-275, respectively. By dynamically adjusting the gate bias voltages, the tolerances for matching NMOS transistors 260-275 may be relaxed, and tuning circuits (e.g., tank circuits using inductors) can be avoided. The gate bias control system 295 may further provide a compensation current to the source degeneration inductor Ls. The compensation current may be used to balance voltages across the transistors within the LNTA. The compensation current may be used to adjust the common mode voltage at (gmpi, gmni, gmpq, gmnq) such that it is equal to Vcommon_reference. Details of the Gate Bias Control 295 are presented below.

As mentioned in the discussion of FIG. 1, other embodiments of the invention (not shown) may include using a gate biasing circuit on both PMOS cascode section 130 and NMOS cascode section 140. Here, both cascode sections 130, 140 may have their transistors gate lines biased by a constant gate voltage. In yet another embodiment, the PMOS cascode section 130 may utilize a gate bias control system to dynamically bias the PMOS transistors 225-240, and the NMOS cascode section 140 may utilize a gate bias circuit to provide a constant bias voltage to each of the NMOS transistors 260-275, thus providing constant voltages for gmpq, gmnq, etc.

As shown in FIG. 2, the single stage design of the LNTA 200 may be facilitated through a parallel connection of complimentary NMOS/PMOS differential input pairs in that together may provide greater transconductance than either a single NMOS differential pair or PMOS differential input pair. The LNTA 200 input may be matched to the source impedance by synthesizing a real input impedance equal to the product of the NMOS transistor input pair's 280, 285 radian transition frequency ($\omega_t$) and the source degeneration inductor Ls 290, which leaves the PMOS input pair 215-220 free for optimization for greatest transconductance with only the capacitive reactance of the PMOS differential pair 215-220 to be matched. The combined capacitive reactance of the PMOS/NMOS differential pairs 215-220/285-280 may be resonated out by the input inductor Lg (not shown) and source degeneration inductor Ls 290.

The drain connection of the differential PMOS/NMOS pairs 215-220/280-285 may be split into two and each path connected through a cascading transistor to realize a high output impedance for each of the four quadrature outputs (gmpq, gmnq, gmpi, gmni). Having separate connections for each of the quadrature outputs (gmpq, gmnq, gmpi, gmni) may isolate them from each other and may ensure there is no common path between the baseband I and Q sections when traced back through the I and Q mixing paths to the LNTA 200. The application of cascode transistors may provide the benefit of isolating the NMOS/PMOS differential pairs from the quadrature outputs that will generally be corrupted by the switching operation of the I/Q mixers. The cascode transistors may also enhance the LNTA's stability and linearity by isolating the (typically) high output conductance of the PMOS/NMOS input differential pair devices from the LNTA's output voltage swing.

The single stage LNTA 200 avoids a two stage design consisting of a high gain, inductively loaded LNA stage used to drive the following transconductance stage. The use of complimentary NMOS and PMOS differential inputs, which are connected in parallel, may optimize transconductance while providing an impedance match to a real source impedance. Moreover, the LNTA 200 cascoded, quadrature output circuit may isolate the LNTA inputs from the outputs, and also isolates the four LNTA outputs from each other.

Figure 3:
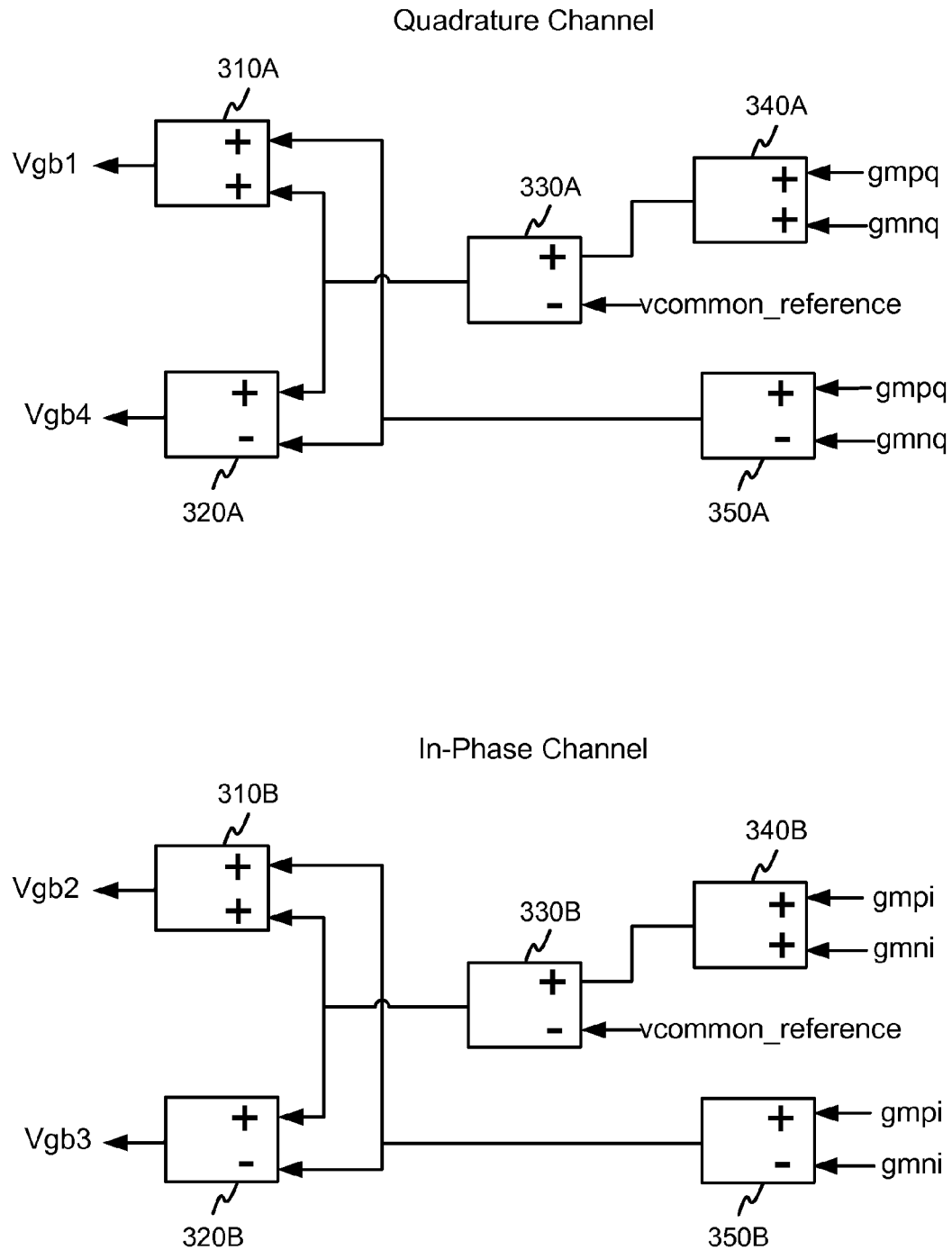
FIG. 3 shows an exemplary gate bias control system which may be used in embodiments of the LNTA.

FIG. 3 shows an exemplary gate bias control system 300 which may be used in various embodiments of the LNTA. The gate bias control system 300 shows both in-phase and quadrature channels. Because each channel utilizes the same operational blocks, the description below will focus on the quadrature channel, but it should be understood that the functional blocks may also be applicable to the in-phase channel.

Initially, the positive quadrature signal may be summed with the negative quadrature signal in summer block 340A to produce a common mode error signal. The positive quadrature signal and the negative quadrature signal may also be "differenced" in difference block 350A to produce a differential mode error signal. The common mode error signal may be compared to a voltage reference (Vcommon_reference) in difference block 330A. Vcommon_reference is the desired common mode voltage formed from the output signals (gmpq, gmnq, gmpi, gmni). This compared signal may be summed with the differential mode error in block 310A to produce Vgb1 (gate bias voltage for NMOS transistor 260). The compared signal may also be "differenced" with the differential mode error signal in block 320A to produce Vgb2 (gate bias voltage for NMOS transistor 265).

Similar operations may be performed in blocks 310B-350B using the in-phase channel to produce Vgb3 (gate bias voltage for NMOS transistor 270) and Vgb4 (gate bias voltage for NMOS transistor 275). Mathematically, the relationship of the gate bias voltages and the in-phase and quadrature signals may be described as follows:

$Vgb1=((gmpq+gmnq)-Vcommon\_reference)+(gmpq-gmnq)/2;$ $Vgb4=((gmpq+gmnq)-Vcommon\_reference)-(gmpq-gmnq)/2;$ $Vgb2=((gmpi+gmni)-Vcommon\_reference)+(gmpi-gmni)/2;$ and $Vgb3=((gmpi+gmni)-Vcommon\_reference)-(gmpi-gmni)/2.$ The Gate Bias Control 300 controls the common mode voltage formed from the output signals (gmpq, gmnq, gmpi, gmni) based upon the Vcommon_reference signal, and drives the differential mode voltages (gmpi−gmni) and (gmpq−gmnq) to zero.

Figure 4:
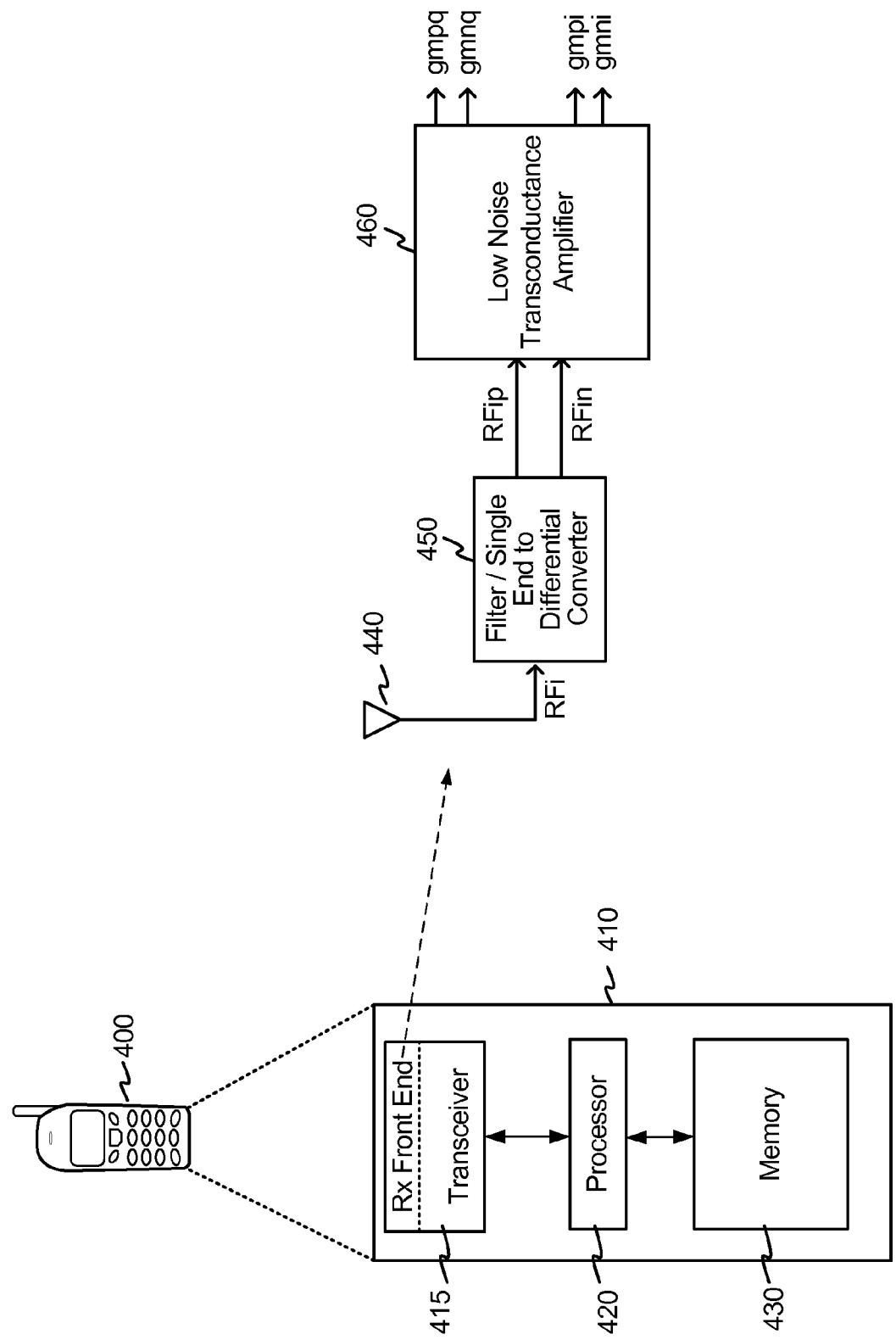
FIG. 4 shows an exemplary application of an LNTA in transceiver of a mobile device.

FIG. 4 shows an exemplary application of a Low Noise Transconductance Amplifier (LNTA) in transceiver of a mobile device 400. The mobile device 400 may have a platform 410 that can exchange data and/or commands over a network. The platform 410 can include a transceiver 415, which may further include a transmitter and receiver (of which only the front end portion of the receiver is explicitly shown). The transceiver may be operably coupled to a processor 420, or other controller, microprocessor, ASIC, logic circuit, or any other type of data processing device. The processor 420 may execute logic that can be stored in the memory 430 of the UE 400. The memory 430 can be comprised of read-only and/or random-access memory (RAM and ROM), EEPROM, flash cards, or any memory common to such platforms.

The various logic elements for providing commands can be embodied in discrete elements, software modules executed on a processor or any combination of software and hardware to achieve the functionality disclosed herein. For example, the processor 420 and the memory 430 may all be used cooperatively to load, store and execute the various functions disclosed herein, and thus the logic to perform these functions may be distributed over various elements. Alternatively, the functionality could be incorporated into one discrete component (e.g., in embedded memory in the processor 420). Therefore, the features of the mobile terminal 400 in FIG. 4 are to be considered merely illustrative and the invention is not limited to the illustrated features or arrangement.

Further referring to FIG. 4, the transceiver 415 shows some details an exemplary receiver front-end which includes an LNTA. The receiver front-end may receive an RF input signal from an antenna 440. The RF input signal, which may be single ended, may then be filtered to reject noise and then converted to a differential RF input signal by block 450. The differential form of the RF input signal may have the advantage of being able to reject common mode noise and thus provide a higher quality signal. The filtered, differential RF input signal may then be fed to a LNTA 460. The LNTA may then amplify the differential RF input signal (RFip, RFin) to provide differential in-phase and quadrature output signals (gmpq, gmnq, gmpi, gmni). These signals may then processed further by a quadrature modulators and other mixers and/or amplifiers to produce baseband I and Q signals and passes the signals through filters 430 into mixers 435. The baseband signals may then be subsequently processed to extract information from these signals.

Figure 5:
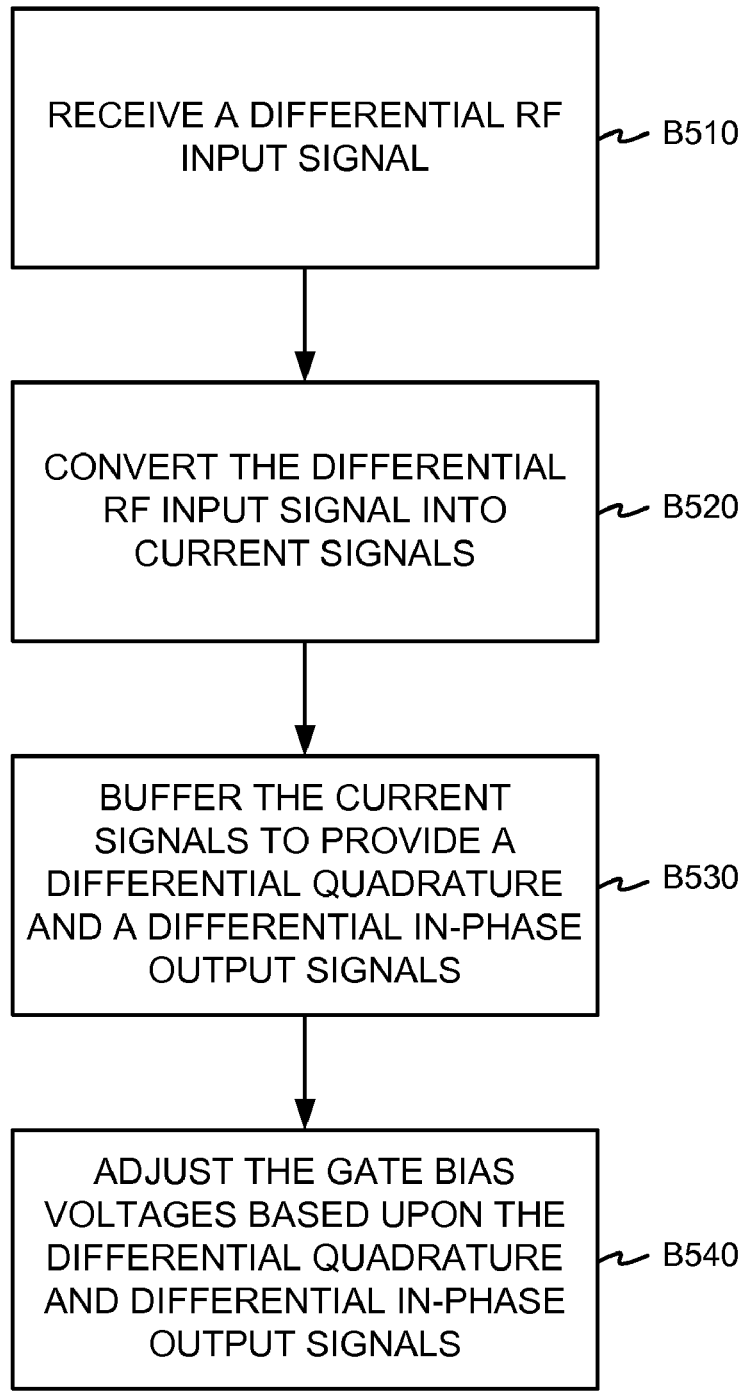
FIG. 5 shows an exemplary flowchart of a process associated with an embodiment of an LNTA.

FIG. 5 shows an exemplary flowchart 500 of a process associated with an embodiment of a Low Noise Transconductance Amplifier. A differential RF input signal may be received at the inputs of the LNTA (B510). This signal may be received at the inputs of the PMOS transconductance section 110 and the NMOS transconductance section 120. The differential RF input signal may be converted into current signals (B520). Each transconductance section 110 and 120 may perform this conversion. The current signals may be buffered to provide an output differential quadrature signal and an output differential in-phase signal (B530). This buffering may be performed by the PMOS cascode section 130 and the NMOS cascode section 140. The output signals may be used to adjust the gate bias voltages (B540). This block may be performed by gate bias control 295.

Embodiments of the invention may be used in conjunction with any portable device and are not limited to the illustrated embodiments. For example, mobile terminals can include cellular telephones, access terminals, music players, radios, GPS receivers, laptop computers, personal digital assistants, and the like.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Accordingly, the invention is not limited to illustrated examples and any means for performing the functionality described herein are included in embodiments of the invention. For example, while various exemplary embodiments described above employ MOS type transistors, other embodiments may utilize any other known transistor types.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A device for providing low noise transconductance amplification, comprising:
   a PMOS transconductance section configured to receive a differential RF input signal;
   a PMOS cascode section coupled to the PMOS transconductance section;
   an NMOS transconductance section configured to receive the RF differential input signal; and
   an NMOS cascode section coupled to the NMOS transconductance section, wherein the PMOS and NMOS cascode sections provide a differential quadrature output signal and a differential in-phase output signal.

2. The device according to claim 1, wherein the PMOS cascode section further comprises:
   a first PMOS transistor having a drain line coupled to the NMOS cascode section;
   a second PMOS transistor having a source line coupled to the source line of the first PMOS transistor, and a drain line coupled to the NMOS cascode section;
   a third PMOS transistor having a drain line coupled to the NMOS cascode section; and
   a fourth PMOS transistor having a source line coupled to the source line of the third PMOS transistor, and a drain line coupled to the NMOS cascode section, wherein the gate lines of the first, second, third and fourth PMOS transistors are coupled to a first gate bias section.

3. The device according to claim 2, wherein the NMOS cascode section further comprises:
   a first NMOS transistor having a drain line coupled to the drain line of the first PMOS transistor;
   a second NMOS transistor having a source line coupled to the source line of the first NMOS transistor, and a drain line coupled to the drain line of the second PMOS transistor;
   a third NMOS transistor having a drain line coupled to the drain line of the third PMOS transistor; and
   a fourth NMOS transistor having a source line coupled to the source line of the third NMOS transistor, and a drain line coupled to the drain line of the fourth PMOS transistor, wherein the gate lines of the first, second, third and fourth NMOS transistors are coupled to a second gate bias section.

4. The device according to claim 3, wherein
   the drain lines of the first PMOS and NMOS transistors provide the positive line of the differential quadrature output signal;
   the drain lines of the second PMOS and NMOS transistors provide the positive line of the differential in-phase output signal;
   the drain lines of the third PMOS and NMOS transistors provide the negative line of the differential in-phase output signal; and
   the drain lines of the fourth PMOS and NMOS transistors provide the negative line of the differential quadrature output signal.

5. The device according to claim 3, wherein the PMOS transconductance section further comprises:
   a fifth PMOS transistor having a source line coupled to a current source, a drain line coupled to the source line of the first and second PMOS transistors, and a gate line capacitively coupled to a negative line of the RF differential input signal; and
   a sixth PMOS transistor having a source line coupled a current source, a drain line coupled to the source line of the third and fourth PMOS transistors, and a gate line capacitively coupled to a positive line of the RF differential input signal.

6. The device according to claim 5, wherein the NMOS transconductance section further comprises:

a fifth NMOS transistor having a source line coupled a source degeneration inductor, a drain line coupled to the source line of the first and second NMOS transistors, and a gate line directly coupled to the negative line of the RF differential input signal; and a sixth NMOS transistor having a source line coupled to the source degeneration inductor, a drain line coupled to the source line of the third and fourth NMOS transistors, and a gate line directly coupled to a positive line of the RF differential input signal.

7. The device according to claim 3, wherein the first gate bias section comprises a first gate biasing circuit which provides a common bias voltage to the gate lines of the first, second, third, and fourth PMOS transistors, and wherein the second gate bias section comprises a second gate biasing circuit which provides a common bias voltage to the gate lines of the first, second, third, and fourth NMOS transistors.

8. The device according to claim 7, wherein the first gate biasing circuit further comprises:
at least one pull-up resistor coupled to the gate lines of the first, second, third, and fourth PMOS transistors; and
a voltage supply coupled to the at least one pull-up resistor.

9. The device according to claim 6, wherein the first gate bias section comprises a gate biasing circuit which provides a common bias voltage to the gates of the first, second, third, and fourth PMOS transistors, and wherein the second gate bias section comprises a gate bias control system which dynamically adjusts each of the voltages the gate lines of the first, second, third, and fourth NMOS transistors based upon the differential in-phase and differential quadrature output signals.

10. The device according to claim 9, wherein the gate bias control system provides a compensation current to the source degeneration inductor.

11. The device according to claim 9, wherein the gate bias control system further comprises:
a first summer module which receives a differential control signal and produces a common mode error signal;
a first difference module which receives the differential control signal and produces a differential mode error signal;
a second difference module which receives the common mode error signal and a reference voltage, and produces a compared signal;
a second summer module which receives the compared signal and the differential mode error signal, and produces a first bias voltage; and
a third difference module which receives the compared signal and the differential mode error signal, and produces a second bias voltage.

12. The device according to claim 11, wherein the differential control signal comprises the differential quadrature input signal, the first bias voltage comprises a gate voltage of the first NMOS transistor, and the second bias voltage comprises a gate voltage for the fourth NMOS transistor.

13. The device according to claim 11, wherein the differential control signal comprises the differential in-phase output signal, the first bias voltage comprises a gate voltage for second NMOS transistor, and the second bias voltage comprises a gate voltage for the third NMOS transistor.

14. The device according to claim 6, wherein the first gate bias section comprises a gate biasing circuit which provides a common bias voltage to the gates of the first, second, third, and fourth NMOS transistors, and wherein the second gate bias section comprises a gate bias control system which separately adjusts each of the voltages the gate lines of the first, second, third, and fourth PMOS transistors based upon the differential in-phase and differential quadrature output signals.

15. A method for amplifying an RF signal, comprising:
receiving a differential RF input signal;
converting the differential RF input signal into current signals; and
buffering the current signals to provide a differential quadrature output signal and a differential in-phase output signal.

16. The method according to claim 15, further comprising:
providing a first set of current signals based upon the differential RF input signal; and
converting the first set of current signals into positive lines of the differential quadrature output signal and the differential in-phase output signal.

17. The method according to claim 15, further comprising:
providing a second set of current signals based upon the differential RF input signal; and
converting the second set of current signals into negative lines of the differential quadrature output signal and the differential in-phase output signal.

18. The method according to claim 15, further comprising:
receiving the differential quadrature output signal and the differential in-phase output signal; and
adjusting dynamically gate bias voltages based upon the differential in-phase and differential quadrature output signals.

19. The method according to claim 18, further comprising:
summing the positive and negative lines of the differential quadrature output signal to produce a common mode error signal;
subtracting the positive and negative lines of the differential quadrature output signal to produce a differential mode error signal;
subtracting the common mode error signal and a reference voltage to produce a compared signal;
summing the compared signal and the differential mode error signal to produce a first gate bias voltage; and
subtracting the compared signal and the differential mode error signal, and produces a fourth gate bias voltage.

20. The method according to claim 18, further comprising:
summing the positive and negative lines of the differential in-phase output signal to produce a common mode error signal;
subtracting the positive and negative lines of the differential in-phase output signal to produce a differential mode error signal;
subtracting the common mode error signal and a reference voltage to produce a compared signal;
summing the compared signal and the differential mode error signal to produce a second gate bias voltage; and
subtracting the compared signal and the differential mode error signal, and produces a third gate bias voltage.

21. A device for providing low noise transconductance amplification, comprising:
means for receiving a differential RF input signal;
means for converting the differential RF input signal into current signals; and
means for buffering the current signals to provide a differential quadrature output signal and a differential in-phase output signal.

22. The device according to claim 21, further comprising:
means for providing a first set of current signals based upon the differential RF input signal; and means for converting the first set of current signals into positive lines of the differential quadrature output signal and the differential in-phase output signal.

23. The device according to claim 21, further comprising:
means for providing a second set of current signals based upon the differential RF input signal; and
means for converting the second set of current signals into negative lines of the differential quadrature output signal and the differential in-phase output signal.

24. The device according to claim 21, further comprising:
means for receiving the differential quadrature output signal and the differential in-phase output signal; and
means for adjusting dynamically gate bias voltages based upon the differential in-phase and differential quadrature output signals.

25. The device according to claim 24, further comprising:
means for summing the positive and negative lines of the differential quadrature output signal to produce a common mode error signal;
means for subtracting the positive and negative lines of the differential quadrature output signal to produce a differential mode error signal;
means for subtracting the common mode error signal and a reference voltage to produce a compared signal;
means for summing the compared signal and the differential mode error signal to produce a first gate bias voltage; and
means for subtracting the compared signal and the differential mode error signal and for producing a fourth gate bias voltage.

26. The device according to claim 24, further comprising:
means for summing the positive and negative lines of the differential in-phase output signal to produce a common mode error signal;
means for subtracting the positive and negative lines of the differential in-phase output signal to produce a differential mode error signal;
means for subtracting the common mode error signal and a reference voltage to produce a compared signal;
means for summing the compared signal and the differential mode error signal to produce a second gate bias voltage; and
means for subtracting the compared signal and the differential mode error signal, and produces a third gate bias voltage.

* * * * *